United States Patent
Godet et al.

(10) Patent No.: US 8,133,804 B1
(45) Date of Patent: Mar. 13, 2012

(54) METHOD AND SYSTEM FOR MODIFYING PATTERNED PHOTORESIST USING MULTI-STEP ION IMPLANTATION

(75) Inventors: Ludovic Godet, Boston, MA (US); Joseph C. Olson, Beverly, MA (US); Patrick M. Martin, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/896,046

(22) Filed: Oct. 1, 2010

(51) Int. Cl.
*H01L 21/425* (2006.01)

(52) U.S. Cl. .. 438/525; 438/527; 438/528; 257/E21.235

(58) Field of Classification Search .................. 438/689, 438/706–712, 725–728, 734, 525, 527, 514, 438/519, 520, 528; 257/E21.235; 216/2, 216/58, 63, 66, 65; 156/345.1, 345.33, 345.35, 156/345.58
See application file for complete search history.

(56) References Cited

U.S. PATENT DOCUMENTS

| | | | | |
|---|---|---|---|---|
| 7,291,563 B2 * | 11/2007 | Abatchev et al. | ............. | 438/694 |
| 7,504,338 B2 * | 3/2009 | Du et al. | ........................ | 438/694 |
| 2007/0010099 A1 * | 1/2007 | Du et al. | ........................ | 438/706 |

* cited by examiner

*Primary Examiner* — Hsien Ming Lee (57) ABSTRACT

A method of reducing the roughness profile in a plurality of patterned resist features. Each patterned resist feature includes a first sidewall and a second sidewall opposite the first sidewall, wherein each patterned resist feature comprises a mid frequency line width roughness and a low frequency linewidth roughness. A plurality of ion exposure cycles are performed, wherein each ion exposure cycle comprises providing ions at a tilt angle of about five degrees or larger upon the first sidewall, and providing ions at a tilt angle of about five degrees or larger upon the second sidewall. Upon the performing of the plurality of ion exposure cycles the mid frequency and low frequency linewidth roughness are reduced.

20 Claims, 8 Drawing Sheets

METHOD AND SYSTEM FOR MODIFYING PATTERNED PHOTORESIST USING MULTI-STEP ION IMPLANTATION

BACKGROUND OF THE INVENTION

1. Field of the Invention

Embodiments of the invention relate to the field of semiconductor device manufacturing. More particularly, the present invention relates to a method, system and structure for patterning a substrate and for implanting into a substrate for manufacturing a semiconductor device.

2. Discussion of Related Art

With continuing miniaturization of electronic devices, there is an increased need for a patterning process capable of achieving finer resolution. Scaling, the ability to print smaller and smaller features, enables the desired design attributes of smaller more complex chips per wafer. Unfortunately, limitations in lithography process equipment can no longer keep up with device scaling requirements. Two key areas stand out in fine feature imaging; the first is a negative attribute referred to as Line Edge or Width Roughness (LER or LWR respectively) and the second is the lack of ability to print tight geometry due to diffraction limits. During the etch step (pattern transfer), the LER roughness from the PR is transferred to the material being etched. LER results in device degradation usually in transistor or parametric stability during testing. Instead of a smooth well defined photoresist image, the patterning process results in a very rough line edge. Depending on the design, either short, medium or long range roughness will have more of an impact on device performance. Since photolithography alone does not produce smooth lines, subsequent steps need to be developed to eliminate or reduce the edge roughness of the lines. To address this problem, several additional processes have been tried yielding only marginal results. For example, dry chemical etch processes have the ability to remove material from the resist image but they suffer pattern dependent loading effects from different exposed areas isolated to dense biases.

In addition, the resist critical dimension (CD) is typically required to be within a tight tolerance, such that any secondary technique should maintain the original resist attributes for profile, height, and CD. Dry chemical etch systems could also impart unwanted defects to the pattern which could result in yield loss. Another alternative approach is the use of a Deep Ultraviolet (DUV) cure where the rough resist pattern is exposed to a lamp based platform to heat the resist through radiation exposure which can smooth the lines. The drawback to this technique is that, after exposure, the corner of the line segments exhibit pattern pull back, and resist lines may deform in such a way to render subsequently produced devices useless. Moreover none of the aforementioned approaches has been observed to reduce low frequency roughness, which may play a large role in degradation of devices, especially those having small CD such as, for example, CD below 100 nm. Accordingly, it will be appreciated that there is a need to improve resist patterning processes for technologies requiring very small feature sizes, such as sub-100 nm CD devices.

SUMMARY OF THE INVENTION

Embodiments of the present invention are directed to methods and systems for patterning a substrate. One embodiment comprises a method of reducing the roughness profile in a plurality of patterned resist features, wherein each patterned resist feature includes a first sidewall and a second sidewall opposite the first sidewall. The method includes performing a plurality of ion exposure cycles to reduce the roughness profile of a resist feature. Each ion exposure cycle comprises providing ions at a tilt angle of about five degrees or larger upon the first sidewall and providing ions at a tilt angle of about five degrees or larger upon the second sidewall.

Another embodiment involves a method of reducing the roughness profile in a plurality of patterned resist features provided on a first surface of a substrate, wherein each patterned resist feature includes a first sidewall and a second sidewall opposite the first sidewall. The method comprises providing the plurality of patterned resist features with a total ion dose by exposing, in a first exposure, the first surface of the substrate to a first ion dose at a first tilt angle that is greater than about five degrees from a substrate normal, wherein the first ion dose impinges on the first sidewall of the plurality of resist features. The first surface of the substrate is exposed, in a second exposure, to a second ion dose at a second tilt angle that is greater than about five degrees from a substrate normal, wherein the second ion dose impinges on the second sidewall of the plurality of resist features. The first surface of the substrate is exposed, in a third exposure, to a third ion dose at a third tilt angle that is greater than about five degrees from a substrate normal, wherein the third ion dose impinges on the first sidewall of the plurality of resist features. The first surface of the substrate is exposed, in a fourth exposure, to a fourth ion dose at a fourth tilt angle that is greater than about five degrees from a substrate normal, wherein the fourth ion dose impinges on the second sidewall of the plurality of resist features, wherein a total exposure dose is equivalent to the sum of the first, second, third and fourth ion doses.

Another embodiment comprises a system for reducing roughness in patterned resist features disposed on a substrate, where each resist feature has a first sidewall and second sidewall opposite the first sidewall. The system includes an ion source operable to provide an ion beam toward the substrate. The system also includes a substrate stage configured to provide a set of relative motions with respect to the ion beam, including a twist motion and a tilt motion. The system further includes a processor and a memory operable to store ion exposure parameters that comprise one or more of: a set of tilt angles, a set of twist angles, a set of ion energies, and a set of ion doses. The system also includes a computer-readable program operable in conjunction with the memory and the processor to send control signals to the ion source and to the substrate stage to perform a plurality of ion exposure cycles. Within each ion exposure cycle the substrate stage is oriented with respect to the ion beam so as to expose, at a tilt angle of about five degrees or larger, the first sidewall and second sidewall in an alternating fashion, to reduce a linewidth roughness profile associated with the patterned resist features.

DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques for improving roughness in patterned photoresist features are disclosed herein. Embodiments of the present invention relate to providing ions to a patterned resist that has a plurality of photoresist features. Photoresist features are subjected to a series of doses (exposures) of ions in which each sidewall of a photoresist feature is subject to a plurality of ion beam exposures (doses) from ion beams incident at a non-normal angle with respect to a substrate. In this manner, the LER, LWR, and medium and long scale roughness are improved for patterned photoresist features, as set forth in detail below.

Figure 1:
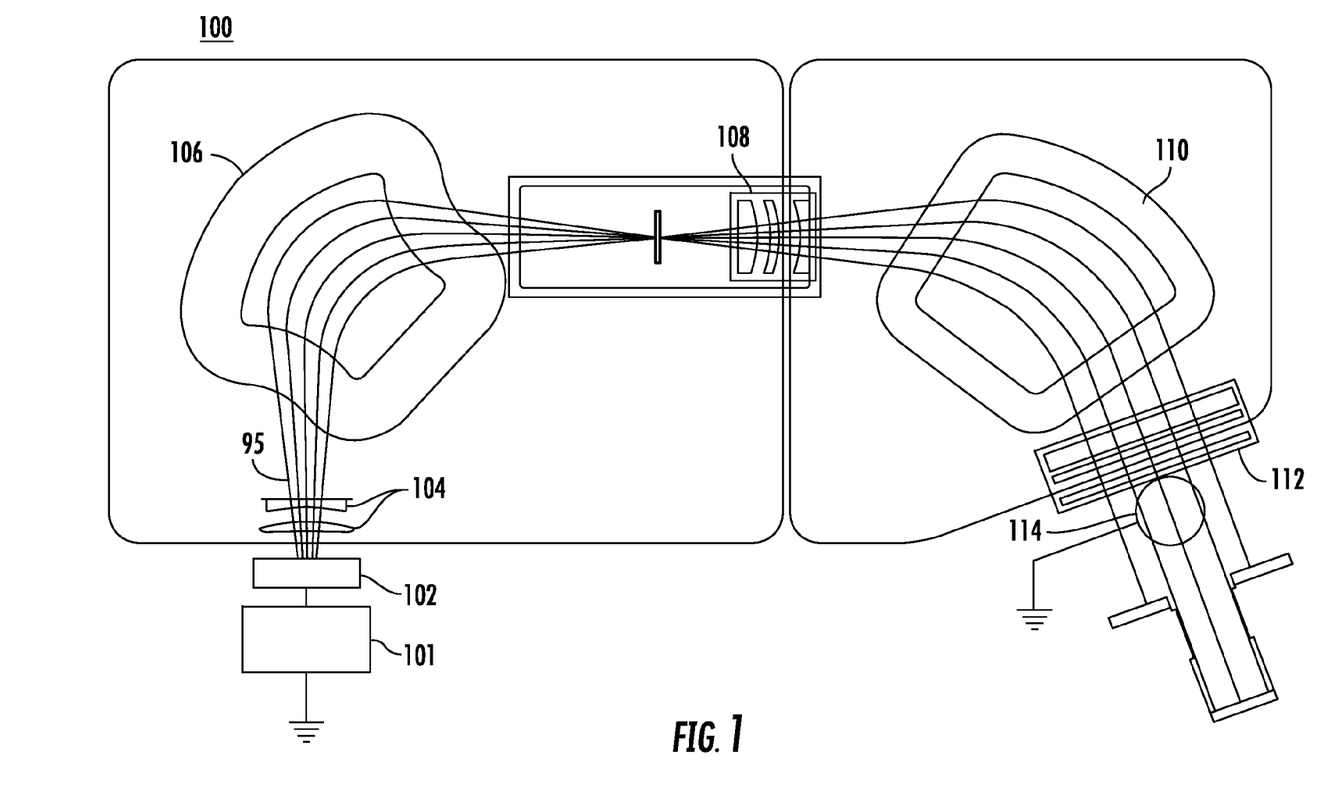
FIG. 1 is a schematic of an ion implantation system.

In a preferred configuration of the invention, ions are provided to a substrate in an ion implantation system. Referring to the drawings, FIG. 1 is a block diagram of an ion implanter that illustrates general features of ion implanters that may be used in embodiments of the present invention. System 100 includes an ion source chamber 102. A power supply 101 supplies the required energy to source 102 which is configured to generate ions of a particular species. The generated ions are extracted from the source through a series of electrodes 104 (extraction electrodes) and formed into a beam 95 which passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a beam targeted toward a work piece or substrate positioned on support (e.g. platen) 114. In some cases, a second deceleration stage 112 may be disposed between corrector magnet 110 and support 114. The ions lose energy when they collide with electrons and nuclei in the substrate and come to rest at a desired depth within the substrate based on the acceleration energy.

In accordance with embodiments of the present invention, the substrate may be attached to a movable stage configured to provide a set of relative motions with respect to a beam, such as beam 95. This may include a translational motion, a twist motion, and a tilt motion. The implantation system 100 includes a tilt stage that provides a substrate tilt with respect to an incident beam, for example, from about −75 to +75 degrees with respect to a normal to the substrate.

Figure 2A:
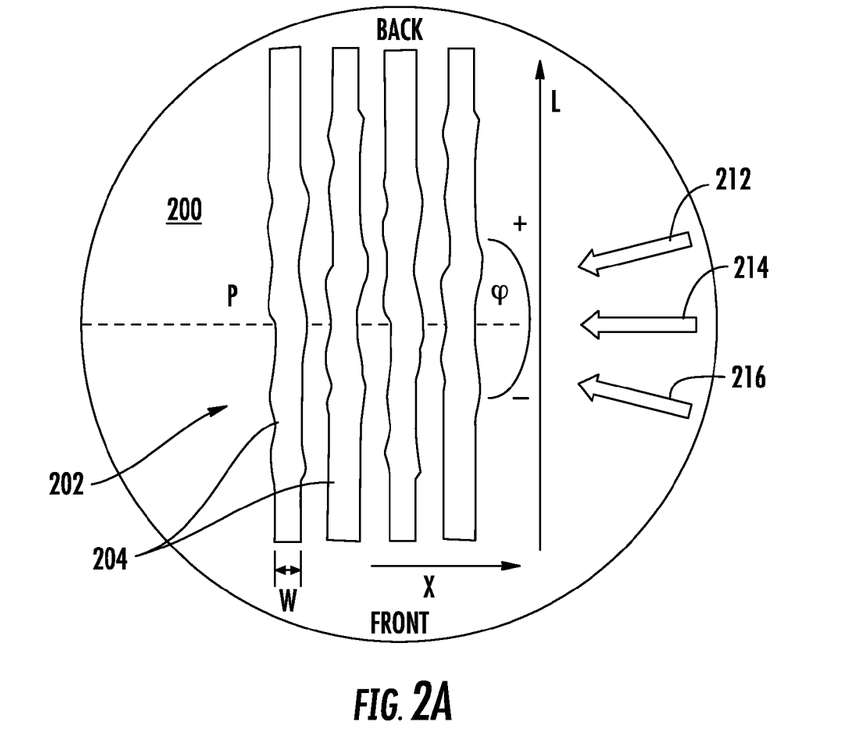
FIG. 2a contains a schematic plan view of a patterned resist that illustrates general features of the invention.
Figure 2B:
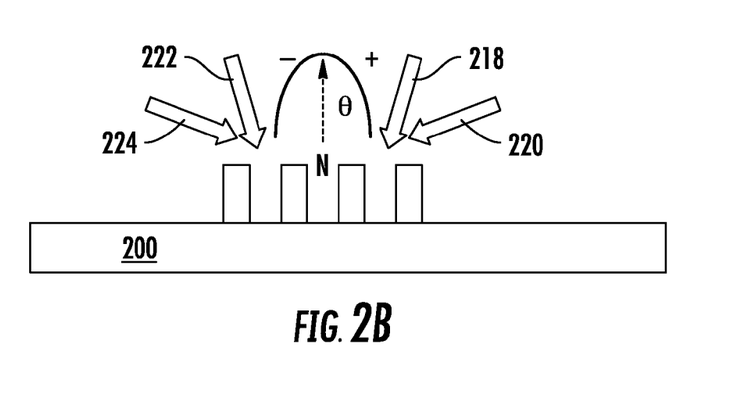
FIG. 2b contains a schematic cross-sectional view of a patterned resist that illustrates general features of the invention.

FIGS. 2a and 2b illustrate general features of a method of the present invention. Included in FIGS. 2a and 2b are schematic depictions of a conventional patterned resist 202 disposed on a substrate 200, shown in plan view, and cross-section, respectively. The patterned resist includes a plurality of lines 204 that are formed after a lithography process is applied to a layer of photoresist. As shown, the linewidth, which is measured in the direction 'x,' varies along the length L of each line 204. Using known lithography processes, the linewidth roughness (LWR) may be a significant fraction of the nominal linewidth especially in resist patterns where the critical dimension is less than about 100 nm. The resist lines 204 may have a nominal CD (W), which is depicted to be the same for the lines shown. As will be readily appreciated by those of skill in the art, if resist lines having a significant linewidth roughness (LWR), adjacent resist lines may have significantly different actual widths due to this linewidth roughness. However, adjacent lines 204 are depicted as similar in dimension for the purposes of explanation and clarity.

In addition to LWR, a "roughness profile" for the resist may include the line edge roughness (LER), as well as the short, medium, and long range LWR variation, which parameters correspond to different length scales along direction L over which linewidth variations occur. In addition to the absolute value of LWR or LER, the length scale over which such variations occur may be a key concern for device fabrication. For example, it is known that long range roughness in photoresist lines may have a different impact than short range roughness on device performance for devices patterned from the photoresist lines.

Figure 2C:
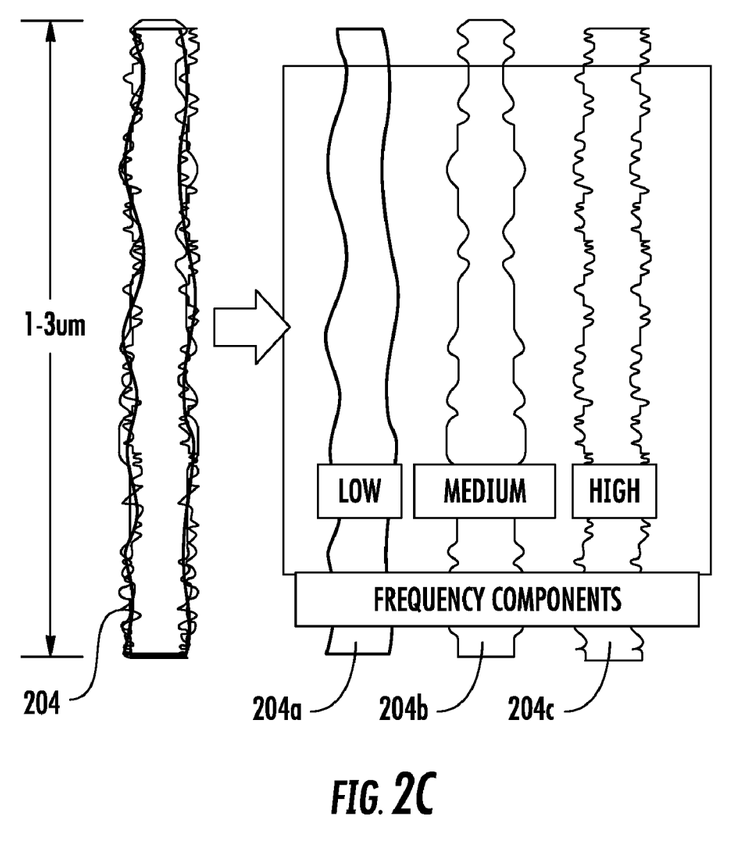
FIG. 2c is a schematic depiction of resist linewidth roughness components.

FIG. 2c illustrates how low frequency (204a), mid frequency (204b) and high frequency (204c) roughness components are obtained from a line 204. These components correspond to the long range, mid range, and short range roughness variations.

In embodiments of the present invention, a patterned resist, such as resist 202, is subjected to a series of ion doses (exposures), resulting in an improvement in the resist roughness profile after the series of exposures. The improvement (or reduction) in roughness profile denotes a reduction in one or of the following: LWR, EWR, and short, medium, or long range roughness variation. The present inventors have discovered that improvements in LWR can be optimized by controlling parameters associated with exposure to ions. These parameters may include, among others, angle(s) of incidence of ions, ion energy, ion type, total ion dose, and the specific sequence of a series of ion exposures, as detailed below.

In accordance with this invention, ions provided to substrate 200 may be incident at a non-zero tilt angle θ with respect to a normal N to the substrate plane, as illustrated in FIG. 2b for ion beams 218, 220, 222, and 224. In embodiments of the invention detailed below, a substrate, such as substrate 200 may be subjected to an ion beam in a series of exposure cycles. Each exposure cycle contains an exposure when the ion beam forms a positive tilt angle and an exposure when the ion beam forms a negative tilt angle. The alternating tilt angles used in each exposure cycle may range from about +/−5 degrees to about +/−85 degrees. Because the ion beam is incident at a non-zero tilt angle with respect to normal, ions may impact sidewalls of resist features and thereby more effectively attack roughness in the resist features.

As illustrated in FIG. 2a, the twist angle φ may also vary, as shown for ion beams 212, 214, and 216, preferably between about zero and about +/−15 degrees. For ion implantation of crystalline silicon wafers, the twist angle is generally defined as the angle formed between the plane that contains the ion beam and the wafer normal and the plane that is perpendicular to a primary flat, which is aligned along the [011] direction in <100> Si. However, as used herein, the term "twist angle" refers to the angle formed between the plane that contains the ion beam and the wafer normal and the plane P that is perpendicular to the long axis L of the patterned resist feature, as illustrated in FIG. 2a. Accordingly, a zero twist angle indicates that the ion beam is in a plane perpendicular to the long axis of the resist lines, regardless of orientation of the underlying wafer.

FIGS. 3a-3e are schematic cross-sectional depictions of a resist pattern, which illustrate exemplary steps involved in a process according to the present disclosure. The figures may represent, for example, a cross-section corresponding to the resist sample 202 of FIGS. 2a, 2b.

Figure 3A:
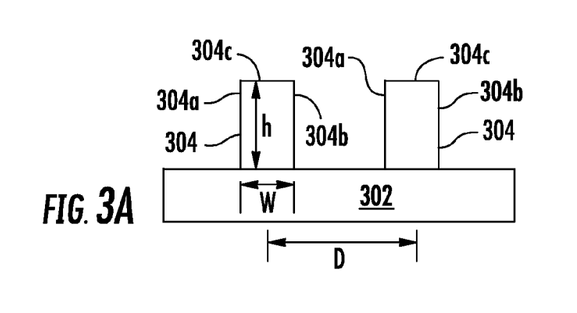
FIGS. 3a-3f are schematic cross-sectional depictions of resist structures that illustrate steps involved in an exemplary multistep ion implantation process.

FIG. 3a illustrates a substrate 302 that includes a pair of resist features 304, shown after patterning using a photolithographic process. The resist lines 304 may have a nominal CD (W), which is depicted to be the same for both lines shown. The resist lines may also have a nominal height h, and may be characterized by a nominal pitch D. As will be readily appreciated by those of skill in the art, for a pattern of resist lines that exhibit significant linewidth roughness (LWR), adjacent resist lines may have significantly different actual widths due to the linewidth variation. However, adjacent lines 304 are depicted as having similar dimension for the purposes of clarity.

Figure 3B:
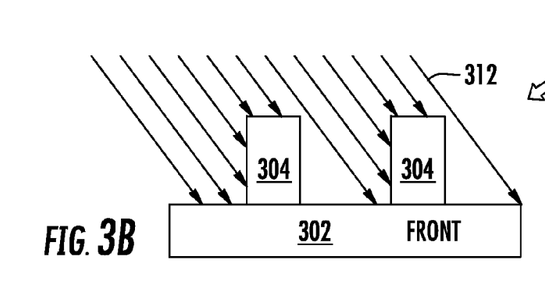

FIGS. 3b-3e illustrate an exemplary multistep ion implantation process, in which the resist lines 304 are exposed to ion beams 312. In this exemplary process, during each step, the ion beams 312 may have the same ion species and the same ion energy. However, in other examples, the ion species and energy may vary between different exposure steps. The ion energy may be about several hundred eV or larger. In particular, the ion energy may range from about 1 KeV to about 20 KeV. In FIG. 3b, a first dose of ions from ion beam 312 is provided at a first non-zero tilt angle toward substrate 302 such that the resist line top surfaces 304c and left sidewalls 304a are exposed to ion flux, whereas the right sidewalls 304b are substantially unexposed to ions. The duration of the exposure step in FIG. 3b may vary, but is generally about one second or greater. During the exposure to ion beam 312, ions impact sidewalls 304a, which may cause localized rearrangement, softening, material removal, or other effects that lead to a smoother sidewall 304b.

Figure 3C:
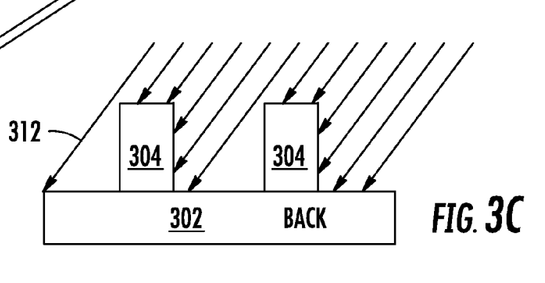

After the first dose of ions is received, the method proceeds to the step in FIG. 3c in which a second dose of ions is provided, at a second non-zero tilt angle toward substrate 302. In one embodiment, the ion energy is the same as that used in the step of FIG. 3b, the second dose is the same as the first dose, and the second non-zero tilt angle forms an angle with respect to the substrate normal that has the same value as the first non-zero tilt angle, but is opposite to the first non-zero tilt angle. For example, the first angle may be +30 degrees while the second angle may be −30 degrees with respect to normal. In this step, the left sidewalls 304a are substantially unexposed to ions while top surfaces 304c and sidewalls 304b are impacted by ions, which may cause localized rearrangement, softening, material removal, or other effects that lead to a smoother sidewall 304b.

Figure 3D:
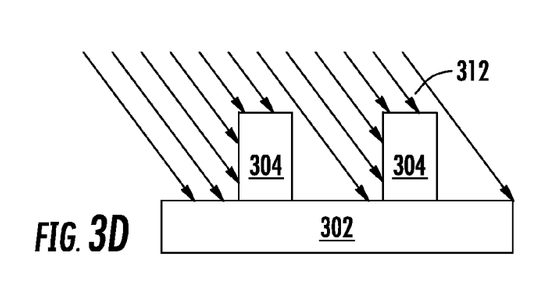

After receiving the second ion dose, the substrate may be exposed to a third ion dose, as depicted at the step illustrated in FIG. 3d. The third dose may be the same as the first dose, or it may be a greater or smaller dose. In one example, the third dose of ions from ion beam 312 is provided at the first non-zero tilt angle toward substrate 302 such that resist line top surfaces 304c and left sidewalls 304a are impacted at a similar angle as in the step of FIG. 3c. During this step, sidewall 304a may experience further localized rearrangement, softening, material removal, or other effects that continue to reduce roughness of sidewall 304b.

Figure 3E:
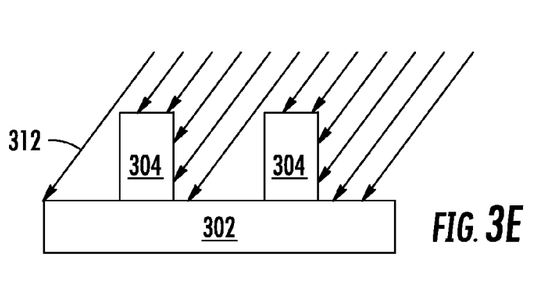

After receiving the third ion dose, the substrate may be exposed to a fourth ion dose, as depicted at the step illustrated in FIG. 3e. The fourth dose may be the same as the second dose, or it may be a greater or smaller dose. In one example, the fourth dose of ions from ion beam 312 is provided at the second non-zero tilt angle toward substrate 302 such that of resist line top surfaces 304c and right sidewalls 304b are impacted at a similar angle as in the step of FIG. 3c. During this step, sidewall 304b may experience further localized rearrangement, softening, material removal, or other effects that continue to reduce roughness of sidewall 304b.

In accordance with the present disclosure, all or some of the steps illustrated in FIGS. 3b-3e may be repeated one or more times.

Advantageously, the method illustrated in FIGS. 3b-3e may reduce roughness in lines 304 in an effective manner without incurring substantial unwanted side effects. Instead of providing a single dose of ions, for example, a single dose for each sidewall 304a, 304b, the method provides multiple ion doses to each sidewall. In particular, the method of the present invention partitions a total dose of ions to be provided to a sidewall into a series of exposures (doses) in which each exposure comprises a portion of the total dose. In this manner, for a given total ion dose, the present inventive method minimizes excessive deformation, heating, decomposition, and/or melting that may take place if a resist line is exposed to the total ion dose in a single exposure.

In the embodiment of the invention depicted generally at FIGS. 3b-3e, the series of exposures to ion beam 312 alternate between opposing sides (that is, left and right sidewalls 304a, 304b) of the resist line. In this manner, each sidewall 304a, 304b enjoys an "idle" period between successive exposures to ion beam 312, while the ion exposure process continues on the opposite sidewall. Thus, a given exposure cycle may be characterized as a first exposure in which a first sidewall is bombarded with ions, while the second (opposite) sidewall is idle, followed by a second exposure in which the second sidewall is bombarded while the first sidewall is idle. The time lapse between the first exposure and the second exposure may vary, but may be substantially less than the duration of the exposure. Accordingly, a total dose of ions may be applied in multiple steps to each sidewall in a time span that may not significantly exceed the time span required to apply the total dose to each sidewall in a single step for each sidewall.

It is to be noted that the switching from a positive tilt angle to a negative tilt angle within an exposure cycle may be performed in more than one manner. For example, this may be accomplished by rotating the substrate along a tilt axis, or may be accomplished by rotating the substrate through a 180 degree twist angle without changing the tilt angle. Referring again to FIGS. 2b, 3b and 3c, the convention for assigning a positive value or negative value for tilt angle θ may be based upon which sidewall the ion flux intercepts. In the example of FIG. 2c, a positive value may be assigned when ion flux impinges on the right sidewall, which may correspond to sidewall 304b, while a negative tilt corresponds to when the ion flux 312 intercepts sidewall 304a.

Figure 3F:
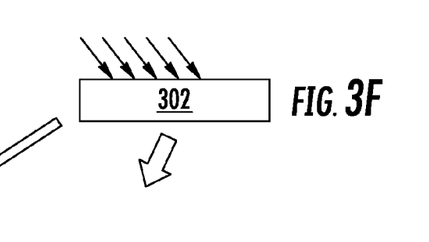

As illustrated by FIG. 3f, both a negative angle (FIG. 3b) and positive angle (FIG. 3c) may be produced without changing the relative orientation of a beam with respect to the substrate plane. In other words, the views depicted in FIGS. 3b and 3c may correspond to the general geometry shown in FIG. 3f in which the beam position does not change and the macroscopic wafer tilt does not change. However, the relative angle tilt angle θ changes from positive to negative by rotating the wafer through a twist angle of 180 degrees. Thus, in one example of the invention, the views depicted in FIGS. 3b and 3c may represent a "front" view of a wafer with zero twist angle and a "back" view of the same wafer (see FIG. 2a) with a 180 degree twist angle.

Figure 4A:
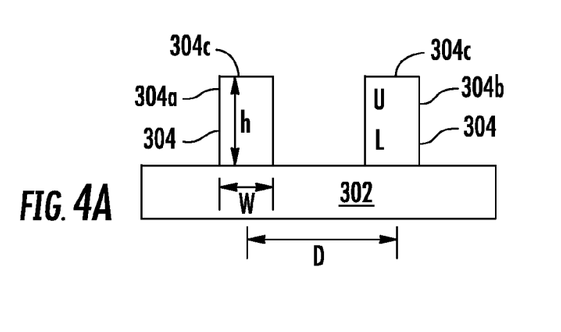
FIGS. 4a-4e illustrate another exemplary multistep ion implantation process.
Figure 4B:
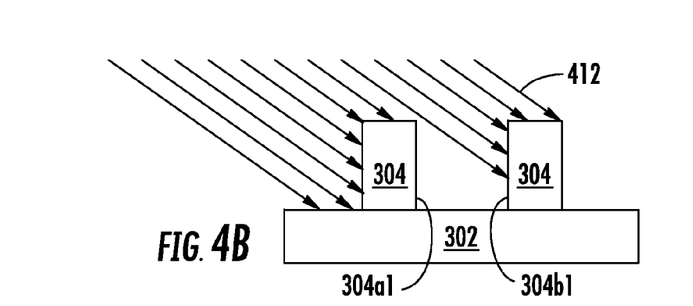

FIGS. 4a-4e illustrate another exemplary multistep ion implantation process, in which the resist lines 304 are exposed to ion beams 412. The process may proceed as in the exemplary method of FIGS. 3b-3e, wherein a series of ion doses are alternately applied to left and right sidewalls 304a, 304b. In comparison to the method of FIGS. 3a-3e, ion beams 412 may be provided at a greater tilt angle in steps of FIGS. 4b-4e. By providing a larger tilt angle, the effect of a given ion dose can be modified. For example, for resist lines 304 that are in the interior of an array may receive more ion flux toward top portions of sidewalls. This situation is illustrated in FIG. 4b by sidewalls 304a1, which receive ion flux from beams 412 in top portions (shown as region U in FIG. 4a) of the respective sidewalls, but not in lower portions (shown as region L in FIG. 4a). Additionally, the greater tilt angle of beams 412 may create a different impact on sidewalls 304a,b as opposed to that created by beams 312 of FIGS. 3b-e.

FIGS. 5a-5e illustrate another exemplary multistep ion implantation process, in which the resist lines 304 are exposed to ion beams 512. In the steps illustrated at FIGS. 5b, 5c the process proceeds similarly to the steps illustrated in FIGS. 3b, 3c. In other words, ion beams 512 may be first provided toward sidewalls 304a using the first ion dose and first non-zero tilt angle, followed by a similar procedure using a second dose at a second non-zero tilt angle for sidewalls 304b. For example, the first tilt angle may be +30 degrees while the second tilt angle may be −30 degrees with respect to normal.

Figure 4C:
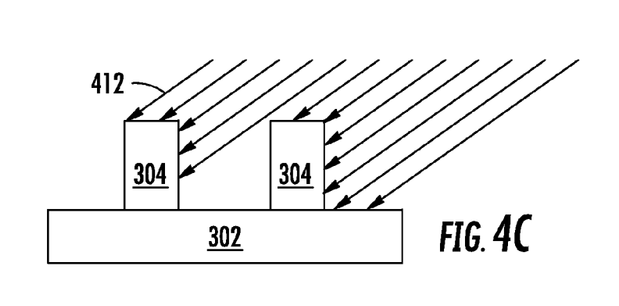
Figure 4D:
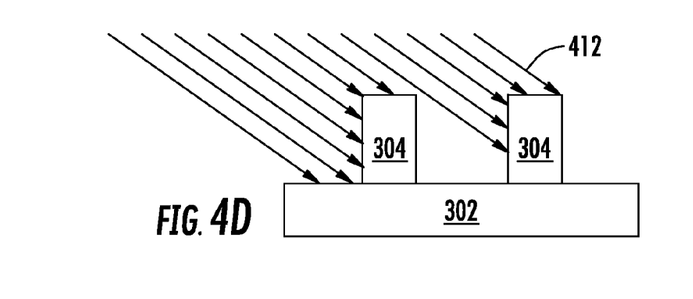
Figure 4E:
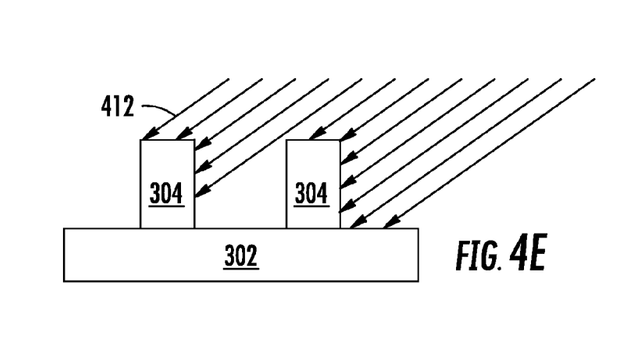
Figures 5A, 5B, 5C, 5D, 5E:
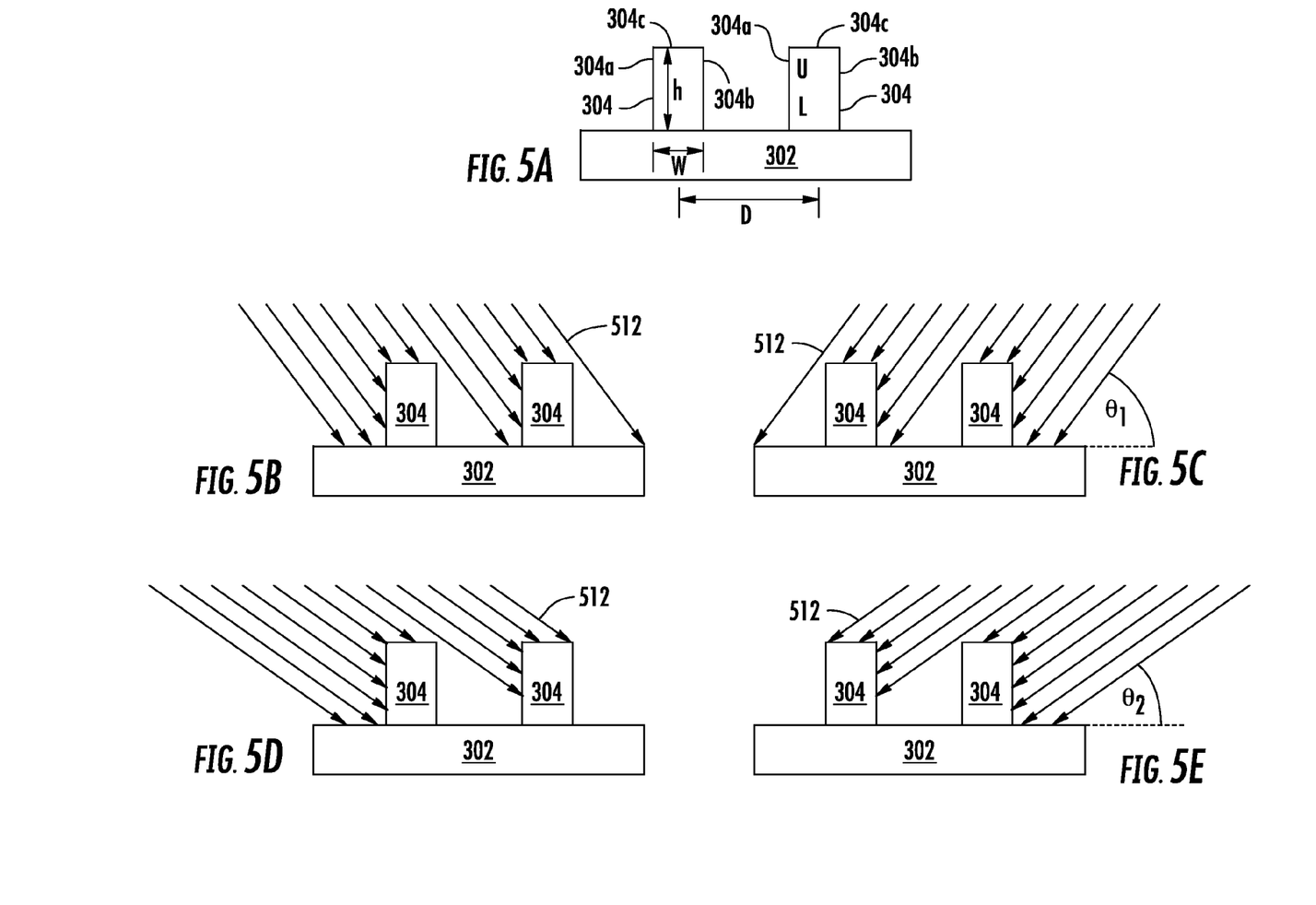
FIGS. 5a-5e illustrate a further exemplary multistep ion implantation process.

In the steps illustrated at FIGS. 5d, 5e the process proceeds similarly to the steps illustrated as in FIGS. 4b, 4c, namely sidewalls 304a and 304b are exposed to ions at a higher tilt angle than that shown in FIGS. 3b, 3c. In this case, the third ion dose and the fourth ion dose may be provided at third and fourth angles of +45 degrees and −45 degrees, respectively.

Accordingly, after the conclusion of the final step, each sidewall 304a, 304b has received a 30 degree implantation dose and a 45 degree implantation dose. By providing separate exposures at 30 and 45 degrees, the exemplary method may combine advantages of each different exposure angle, in an additive or synergistic fashion.

In an alternative embodiment, the steps depicted in FIGS. 5d and 5e may be performed before those in FIGS. 5b and 5c. In exemplary methods that involve multistep ion implantation processes in which the angle of ion incidence is varied between steps, the sequence of ion exposures may be tailored to provide an optimal reduction in line roughness. Choice of the exact sequence of exposures may be based upon factors such as the initial resist profile, linewidth, and other factors. For example, it may be more effective to expose sidewalls to ions at low tilt angle before exposure at high tilt angle, as illustrated in FIGS. 5b-5e.

For the exemplary methods generally depicted in FIGS. 3-5, in some embodiments, the substrate may be maintained at a twist angle of zero degrees. However, in other embodiments, the twist angle may be non-zero. For example, in a method of the invention, a first dose of ions from ion beam 312 may be provided at +45 degree tilt, +15 degrees twist, followed by a second dose of ions at −45 degrees tilt, +15 degrees tilt. The method may continue with a third dose at +45 degrees tilt and −15 degrees twist, followed by −45 degrees tilt, −15 degrees twist. Many other combinations of ion exposure steps are possible in which each resist line sidewall is exposed to a total ion dose through a plurality of ion exposures.

Figure 6:
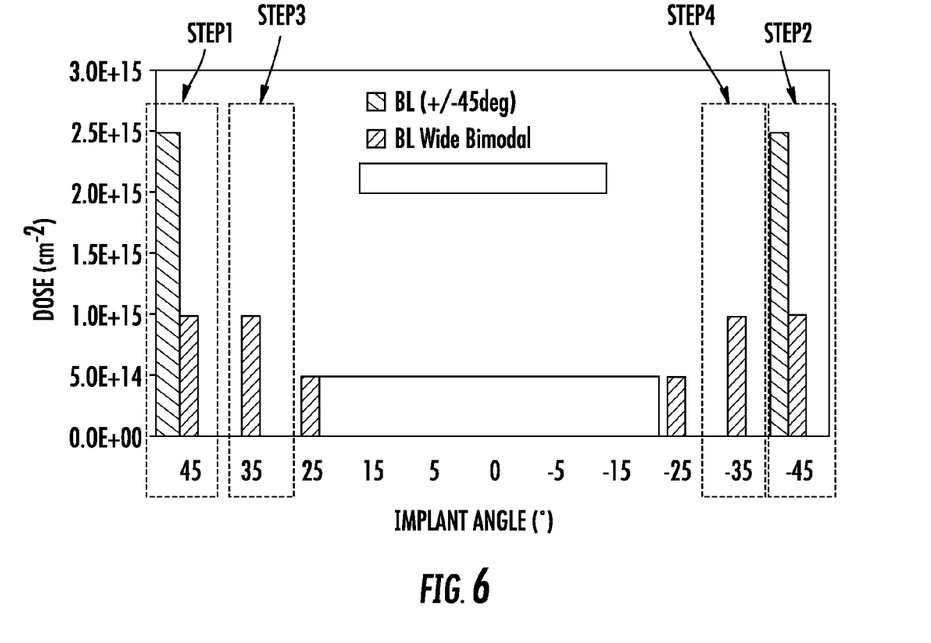
FIG. 6 is a graph that depicts details of a multistep ion implantation processes.
Figure 7:
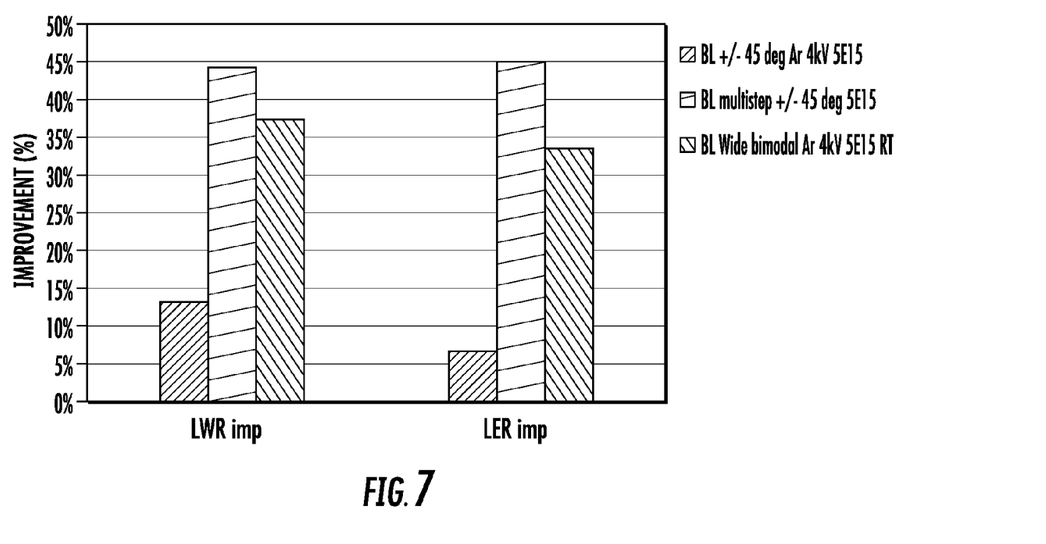
FIG. 7 is a graph that depicts results of LWR and EWR measurements for resist samples subjected to the multistep ion implantation processes of FIG. 6.

The effect on line roughness of various process sequences was studied using 4 keV Ar ion beams, as illustrated in FIGS. 6 and 7. FIG. 6 is a graph that depicts the ion dose and tilt angle used for several different recipes, each of which provides a total dose of 5 E15/cm$^2$. A first recipe ("BL+/−45") comprises a first step that provides a 2.5 E15/cm$^2$ dose of ions at +45 degrees, and a second step that provides a 2.5 E15/cm$^2$ dose of ions at −45 degrees. According to a second recipe ("BL wide bimodal") the first step provides a 1.0 E15/cm$^2$ dose of ions at +45 degrees, the second step provides a 1.0 E15/cm$^2$ dose of ions at −45 degrees, the third step provides a 1.0 E15/cm$^2$ dose of ions at +35 degrees, the fourth step provides a 1.0 E15/cm$^2$ dose of ions at −35 degrees, the fifth step provides a 0.5 E15/cm$^2$ dose of ions at +25 degrees, and the sixth step provides a 0.5 E15/cm$^2$ dose of ions at −25 degrees. During exposure of resist patterns to each recipe, resist lines were oriented in such a manner that +45 degree ion beam tilt exposes a first side of resist lines, while a −45 degree tilt exposes the opposite side, as depicted in FIGS. 3-5 herein.

Figure 8:
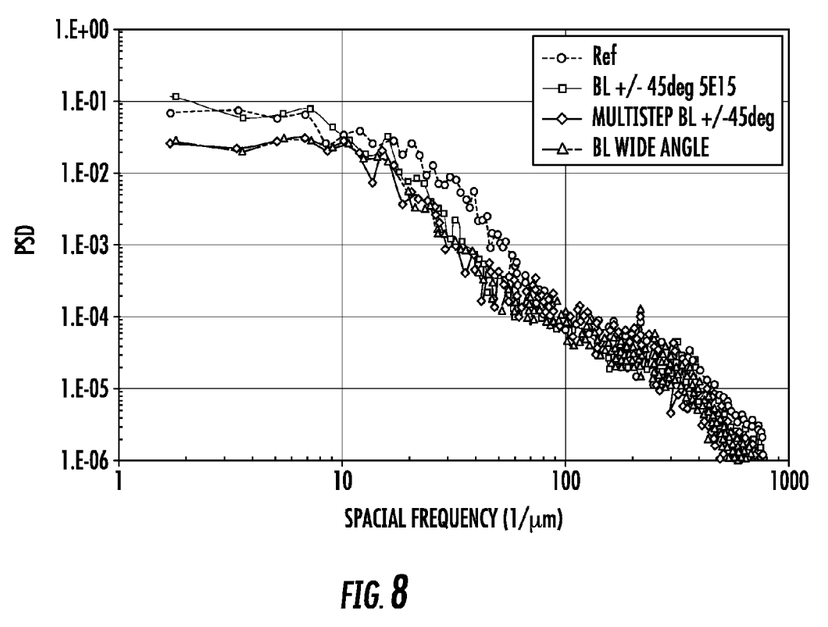
FIG. 8 is a graph that shows the power spectrum distribution of LWR before and after exposure to ions for the multistep ion implantation processes of FIG. 6.

FIGS. 7 and 8 depict results of measurements on the roughness profile of 45-47 nm wide resist lines subjected to the aforementioned ion exposure recipes of FIG. 6. FIGS. 7 and 8 also shows the results for resist samples subject to a third recipe ("BL multistep+/−45") that comprises a multiple step exposure in which all exposures are performed at 45 degree tilt: the first step provides 1E15/cm$^2$ ions at +45 degrees, the second step provides 1E15/cm$^2$ ions at −45 degrees, the third step provides 1E15/cm$^2$ ions ions at +45 degrees, the fourth step provides 1E15/cm$^2$ ions ions at −45 degrees, the fifth step provides 0.5 E15/cm$^2$ ions ions at +45 degrees, and the sixth step provides 0.5/cm$^2$ E15 ions ions at −45 degrees.

As compared to a control sample, each recipe reduces the resist roughness. In particular, the "BL multistep" and "BL wide bimodal" recipes produce a substantial improvement in the roughness profile. The term "substantial improvement" as used herein in conjunction with roughness profile, denotes a reduction of about 5% or more in LER and/or LWR, and/or about a 10% or greater reduction in the average power density spectrum signal in the medium frequency range, low frequency range, or both. LWR and LER are reduced by 13% and 7%, respectively, when using the first recipe, where each sidewall receives a single 2.5 E15/cm$^2$ dose of ions at 45 degree tilt. In contrast, after using the "BL multistep" a 45% reduction in LWR and LER occur, while use of the "BL wide bimodal" recipe produces a 37% and 35% reduction in LWR and LER, respectively.

FIG. 8 shows the power spectrum distribution of LWR before (REF) and after exposure to ions for the same set of recipes illustrated in FIG. 7. Exposure to ion flux may reduce the high frequency ((100-1000)/um) roughness slightly, while the mid frequency ((10-100)/um) roughness signal is significantly decreased using all three recipes. However, low frequency ((1-10)/um) roughness is significantly reduced only for "BL multistep" and "BL wide bimodal," which both provide multiple ion exposures to each resist sidewall. The average low frequency PSD intensity is reduced by about 50% or so for both "BL multistep" and "BL wide bimodal" ion treatments.

Accordingly, a 5 E15/cm$^2$ dose of Ar ions, when partitioned into multiple exposures for each sidewall of a resist line, is much more effective than using a single dose for each sidewall for the purposes of reducing the resist line roughness profile, as evidenced by LWR, EWR, and power spectra measurements.

The present invention covers other multistep implantation recipes. For example, a "flat distribution" may comprise a series of steps in which equal doses (such as 5 E14/cm$^2$) are applied at various tilt angles according to the following sequence: +5 degrees, −5 degrees, +15 degrees, −15 degrees, +25 degrees, −25 degrees, +35 degrees, −35 degrees, +45 degrees, and −45 degrees.

Referring again to FIG. 2c, the present invention provides an improved resist mask structure for narrow resist features. The resist mask structure is formed after the narrow resist features are implanted with total dose of ions in the range of greater than about 5 E14/cm$^2$ and preferably in the range of 1-10E15/cm.$^2$ A hallmark of the resist mask structures of the present invention is the significantly reduced long length scale and medium length scale roughness features that are present in resist mask structures produced by photolithography without being subjected to the processes of this invention. Nor do prior techniques produce this type of resist mask structure having the reduced long scale roughness.

In summary, the present invention provides methods and systems for reducing roughness in a patterned resist by providing a total dose of ions at a non-zero tilt angle such that ions can impact a resist sidewall. The total dose of ions is partitioned into more than one (a multistep) exposure. Using this multistep exposure method, the present invention provides a set of parameters that can be tuned to provide optimal reduction in line roughness, to account for factors such as variations in resist pattern geometry, in the quality of the lithography process used to produce a resist pattern, in the type of resist system, and other factors. Each of these factors may require a different combination of parameters, such as tilt angle(s), twist angle, number of ion beam exposures for each resist sidewall, sequence of exposures, and other parameters.

Herein, a novel and inventive technique for improving roughness in patterned resist is disclosed. The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, although embodiments of the present invention described hereinabove have been generally directed to using Ar ion bombardment, the present invention can be implemented with other ion species. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of reducing the roughness profile in a plurality of patterned resist features provided on a substrate, each patterned resist feature comprising a first sidewall and a second sidewall opposite the first sidewall, each patterned resist feature further comprising a roughness profile, the method comprising:

performing a plurality of ion exposure cycles to reduce the roughness profile of a resist feature, wherein each ion exposure cycle comprises:
providing ions at a first tilt angle of about five degrees or larger from a substrate normal upon the first sidewall; and
providing ions at a second tilt angle of about five degrees or larger from the substrate normal upon the second sidewall.

2. The method of claim 1 wherein in each ion exposure cycle, the first tilt angle is equal in magnitude to the second tilt angle.

3. The method of claim 1, wherein the first tilt angle varies between a first ion exposure cycle and a second ion exposure cycle.

4. The method of claim 1 wherein, in a first exposure cycle the ions form a non-zero twist angle about a normal to a surface of the sidewalls, and wherein in a second exposure cycle the ion beam forms the non-zero angle in an opposite direction about the normal to the surface of the sidewalls.

5. The method of claim 1, wherein the first tilt angle in a first exposure cycle is less than the first tilt angle in a second exposure cycle.

6. A method of reducing the roughness profile in a plurality of patterned resist features provided on a first surface of a substrate, wherein each patterned resist feature includes a first sidewall and a second sidewall opposite the first sidewall, the method comprising:

providing the plurality of patterned resist features with a total ion dose by:
exposing, in a first exposure, the first surface of the substrate to a first ion dose at a first tilt angle that is greater than about five degrees from a substrate normal wherein the first ion dose impinges on the first sidewall of the plurality of patterned resist features;
exposing, in a second exposure, the first surface of the substrate to a second ion dose at a second tilt angle that is greater than about five degrees from the substrate normal wherein the second ion dose impinges on the second sidewall of the plurality of patterned resist features;
exposing, in a third exposure, the first surface of the substrate to a third ion dose at a third tilt angle that is greater than about five degrees from the substrate normal, wherein the third ion dose impinges on the first sidewall of the plurality of patterned resist features; and
exposing, in a fourth exposure, the first surface of the substrate to a fourth ion dose at a fourth tilt angle that is greater than about five degrees from the substrate normal, wherein the fourth ion dose impinges on the second sidewall of the plurality of patterned resist features, wherein the total ion dose is equivalent to a sum of the first, second, third and fourth ion doses.

7. The method of claim 6, wherein the first tilt angle forms an angle that is equivalent in magnitude to the second tilt angle, and wherein the third tilt angle forms an angle that is equivalent in magnitude to the fourth tilt angle.

8. The method of claim 7, wherein the first tilt angle and third tilt angle are the equal.

9. The method of claim 7, wherein the first tilt angle and third tilt angle form different angles with respect to the substrate normal.

10. The method of claim 9, wherein the first tilt angle forms a larger angle with respect to the substrate normal than the third tilt angle.

11. The method of claim 9, wherein the first tilt angle forms a smaller angle with respect to the substrate normal than the third tilt angle.

12. The method of claim 6, wherein the first ion dose and second ion dose are equal, and the third ion dose and fourth ion dose are equal.

13. The method of claim 12, wherein the first ion dose is greater than the third ion dose.

14. The method of claim 6, wherein the total ion dose is between about 5 E14/cm$^2$ and about 2.0 E16/cm$^2$.

15. The method of claim 6, wherein the total ion dose comprises a dose of ions selected from the group consisting of helium, neon, argon, krypton, xenon, and radon.

16. The method of claim 6, wherein the total ion dose is received by the patterned resist features at an equal ion energy for each of the first, second, third, and fourth ion doses.

17. The method of claim 6, further comprising exposing the first surface of the substrate to one or more additional exposure cycles, wherein each additional exposure cycle comprises:
exposing the first surface of the substrate to ion impingement at an additional tilt angle that is greater than about five degrees from the substrate normal, wherein ions impinge on the first sidewall of the plurality of patterned resist features; and
exposing the first surface of the substrate to ion impingement at another tilt angle that is greater than about five degrees from the substrate normal, wherein ions impinge on the second sidewall of the plurality of patterned resist features.

18. The method of claim 17, wherein the first tilt angle forms an angle that is equivalent in magnitude to the second tilt angle, the third tilt angle forms an angle that is equivalent in magnitude to the fourth tilt angle, and in each additional exposure cycle, the additional tilt angle forms an angle that is equivalent in magnitude to the another tilt angle.

19. The method of claim 6, further comprising, between each exposure, rotating the substrate through a twist angle.

20. The method of claim 6, wherein the total ion dose is provided without breaking vacuum between exposures in a chamber containing the substrate.

* * * * *